United States Patent
Hsu et al.

(10) Patent No.: US 9,898,983 B1
(45) Date of Patent: Feb. 20, 2018

(54) SOURCE DRIVING DEVICE WITH 3 TYPES OF GATE OXIDE LAYER

(71) Applicant: NOVATEK Microelectronics Corp., Hsin-Chu (TW)

(72) Inventors: Yu-Hao Hsu, Hsinchu County (TW); Jui-Chang Lin, Hsinchu (TW); Ming-Han Lee, Hsinchu (TW); Wei-Cheng Lin, Hsinchu County (TW)

(73) Assignee: NOVATEK Mircroelectronics Corp., Hsin-Chu (TW)

( * ) Notice: Subject to any disclaimer, the term of this patent is extended or adjusted under 35 U.S.C. 154(b) by 0 days.

(21) Appl. No.: 15/344,575

(22) Filed: Nov. 6, 2016

Related U.S. Application Data (60) Provisional application No. 62/372,760, filed on Aug. 9, 2016.

(51) Int. Cl.
*G09G 5/00* (2006.01)
*G09G 3/36* (2006.01)

(52) U.S. Cl.
CPC ......... *G09G 3/3648* (2013.01); *G09G 3/3688* (2013.01); *G09G 3/3696* (2013.01); *G09G 2300/04* (2013.01)

(58) Field of Classification Search
CPC .... G09G 3/3648; G09G 3/367; G09G 3/3696; G09G 3/3688; G09G 2300/04
See application file for complete search history.

(56) References Cited

U.S. PATENT DOCUMENTS

| | | | | |
|---|---|---|---|---|
| 7,576,724 B2 * | 8/2009 | Lin | ...... | G09G 3/2074 345/100 |
| 8,174,520 B2 * | 5/2012 | Lin | ...... | G09G 3/3688 345/100 |
| 2007/0030237 A1 * | 2/2007 | Chen | ...... | G09G 3/2074 345/100 |
| 2007/0030238 A1 * | 2/2007 | Lin | ...... | G09G 3/2074 345/100 |
| 2011/0050679 A1 * | 3/2011 | Lin | ...... | G09G 3/3688 345/214 |

* cited by examiner

*Primary Examiner* — Vijay Shankar
(74) *Attorney, Agent, or Firm* — Winston Hsu (57) ABSTRACT

A source driving device for a display system includes a receiving module, for receiving display data; a register module, for sorting pixel data included in the display data to generate sorted pixel data; a latch module, for outputting sequenced display data to the level shifting module; a level shifting module, for adjusting the sequenced display data from a low voltage range to a medium voltage range; a converting module; for converting the sequenced display data to analog display voltages; a buffer module, for generating a plurality source driving signals according to the analog display voltages; and an output switching module, for outputting the plurality source driving signals to a display device of the display system operating in a high voltage range; wherein circuit components in the source driving device operating in different voltage ranges have different gate oxide thicknesses.

7 Claims, 6 Drawing Sheets

SOURCE DRIVING DEVICE WITH 3 TYPES OF GATE OXIDE LAYER

CROSS REFERENCE TO RELATED APPLICATIONS

This application claims the benefit of U.S. Provisional Application No. 62/372,760 filed on 2016 Aug. 9, the contents of which are incorporated herein in their entirety.

BACKGROUND OF THE INVENTION

1. Field of the Invention

The present invention relates to a source driving device, and more particularly, to a source driving device with 3 types of gate oxide layer.

2. Description of the Prior Art

The integrated circuit (IC), also called the mother of information technology (IT) industry, is the most basic and the most important components in the IT products. The IC is realized by configuring circuit components such as transistors, diodes, resistors and capacitors on a silicon chip, to form a complete logic circuit, so as to achieve functions of controlling, calculating and memorizing and to handle various affairs for people.

According to different applications, the integrated circuits may comprise circuit components operating in different voltage ranges. In a display device (e.g. a liquid crystal display (LCD)), a source driver integrated circuit (IC) is generally implemented by high voltage circuit components and low voltage circuit components. When circuits in the source driver IC are required to operate within a medium voltage range, whose maximum voltage is greater than that of the low voltage range and smaller than that of the high voltage range, the circuits operating within the medium voltage range are implemented by the circuit components designed for the high voltage range adopting different layout rules. Because the component structure of the circuit components of the high voltage range is not designed for operating within the medium voltage range, the performances of the circuits operating within the medium voltage range in the conventional source driver IC are inherently limited. Thus, how to improve the performances of the circuits operating within the medium voltage in the conventional source driver IC becomes a topic to be discussed.

SUMMARY OF THE INVENTION

In order to solve the above issue, the present invention provides a source driving device with 3 types of gate oxide layer.

In an aspect, a source driving device for a display system is disclosed. The source driving device comprises a receiving module, a register module, a latch module, a level shifting module, a converting module, a buffer module, and an output switch module. The receiving module is utilized for receiving display data. The register module is utilized for sorting pixel data included in the display data to generate sorted pixel data. The latch module is utilized for outputting sequenced display data to the level shifting module. The level shifting module is utilized adjusting the sequenced display data from a low voltage range to a medium voltage range. The converting module is utilized for converting the sequenced display data to analog display voltages. The buffer module is utilized for buffering the analog display voltages; and an output switching module, for outputting the buffered analog display voltages to a display device of the display system operating in a high voltage range; wherein circuit components in the source driving device operating indifferent voltage ranges have different gate oxide thicknesses.

In the present disclosure, the circuit components operating within different voltage ranges equip with different gate oxide thicknesses. Instead of utilizing the circuit components designed for the high voltage range to realize the circuit components operating within the medium voltage range, the present disclosure makes the circuit components operating within the medium voltage range equip with unique gate oxide thickness. The performance of the circuits operating within the medium voltage range can be largely improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
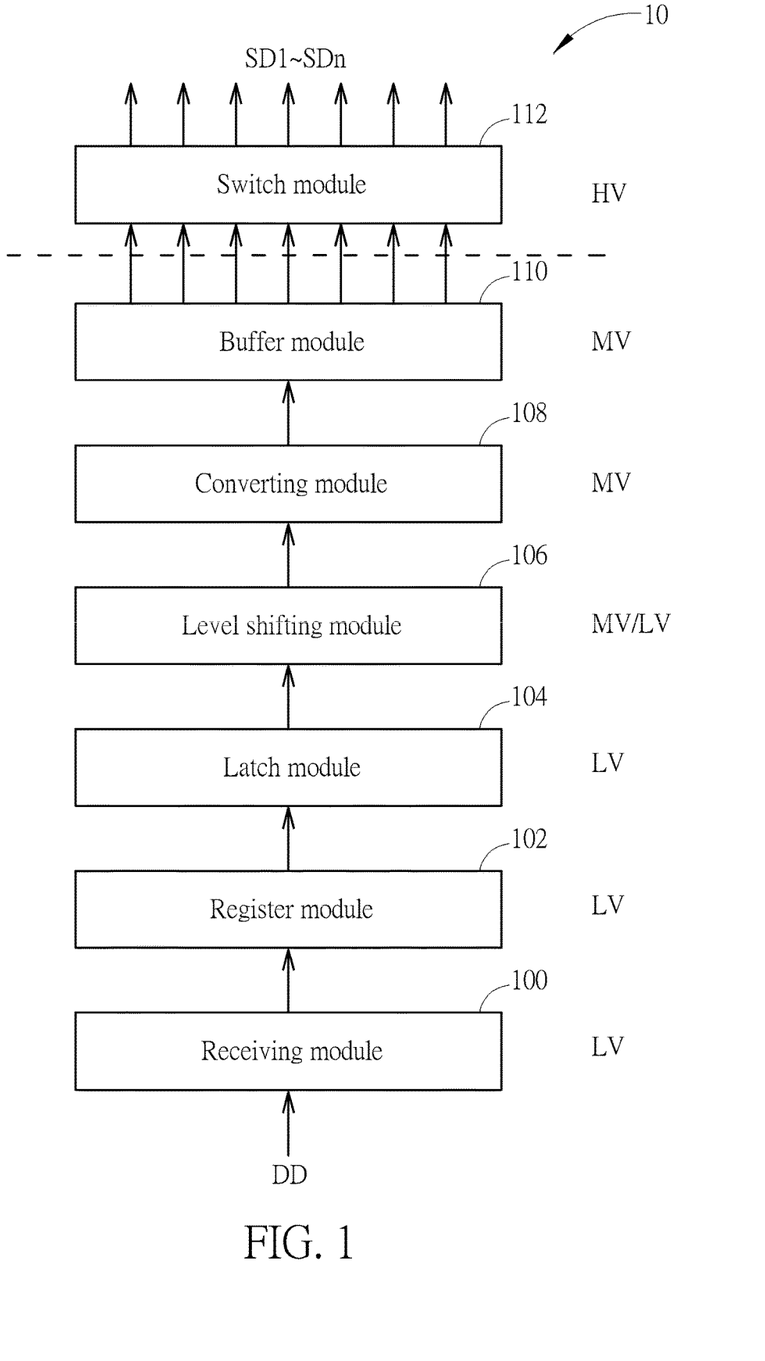
FIG. 1 is a schematic diagram of a source driving device according to an example of the present invention.

Please refer to FIG. 1, which is a schematic diagram of a source driving device 10 according to an example of the present invention. The source driving device 10 may be a source driver in a display system, such as a liquid crystal display (LCD), a smart phone, a tablet or an electronic product with a liquid crystal display panel. As shown in FIG. 1, the source driving device 10 comprises a receiving module 100, a register module 102, a latch module 104, a level shifting module 106, a converting module 108, a buffer module 110, and an output switch module 112. The source driving device 10 is utilized to receive digital display data DD_D and accordingly generate source driving signals SD1-SDn of driving pixels in a display device (e.g. a display panel) of the display system. In this example, the source driving device 10 consists of circuit components (e.g. metal-oxide-semiconductor field-effect transistors (MOSFETs)) equipping with 3 different gate oxide thicknesses and different gate oxide thicknesses are corresponding to the circuit components operating in different voltage ranges. Via adopting the circuit components equipping with 3 different gate oxide thicknesses, the performance of the source driving device 10 can be greatly improved.

In details, the receiving module 100 is utilized to receive the digital display data DD within a low voltage range LV, whose maximum voltage may be 3.3 volts, 1.8 volts or 1.2 volts. For example, the receiving module 100 may comprises a receiver for receiving the digital display data DD and a clock data recovery (CDR) circuit for adjusting a clock signal of receiving the digital display data DD. Next, the register module 102 sorts pixel data included in the digital display data DD_D according to the pixel locations corresponding to the pixel data and transmits the sorted pixel data to the latch module. When the pixel data corresponding to the pixels located on a row is ready, the latch module 104 outputs the pixel data corresponding to the pixels located on the same row to the level shifting module 106 and the level shifting module 106 shifting the voltage range of the pixel data from the low voltage range LV to a medium voltage range MV, whose maximum voltage may be between 5-11 volts. The converting module 106, such as a digital-to-analog converter (DAC), converts the pixel data within the medium voltage range MV to corresponded pixel voltages and outputs the pixel voltages to the buffer module 110. Then, the buffer module 110 generates the source driving signals SD1-SDN according to the pixel voltages, to drive the pixels of the display device (not shown in FIG. 1). The output switch module 112 is utilized to control timings of outputting the source driving signals SD1-SDn to the display device and to switch the source driving signals corresponding to the same pixel according to an inversion type (e.g. a dot inversion, a frame inversion, or a line inversion) of the display device. Note that, the output switch module 112 operates within a high voltage range HV that is the operational voltage range of the display device, to prevent the circuit components from being damaged. In an example, the maximum voltage of the high voltage range HV is between 15-21 volts.

In FIG. 1, the receiving module 100, the register module 102, the latch module 104 and parts of level shifting module 106 are realized by low voltage circuit components designed for the low voltage range LV; remaining parts of the level shifting module 106, the converting module 108, and the buffer module 110 are realized by medium voltage circuit components designed for the medium voltage range MV; and the switch module 110 is realized by high voltage circuit components designed for the high voltage range HV. In the convention art, the medium circuit components are realized by the high voltage circuit components whose layout rules are appropriately altered. For example, the MOSFETs operating within the medium voltage range MV can be realized by the MOSFETs designed for the high voltage range HV whose layout rules of source and drain are adjusted in the conventional art. In an example, the MOSFETs operating within the medium voltage range MV are realized by Middle-High-Middle (MHM) transistors and/or Low-High-Low (LHL) transistors. Note that, MHM and LHL represent withstand voltage levels of drain, gate, and source of the transistor. That is, the drain, gate and source of the MHM transistor equip with middle, high, and middle withstand voltage levels, respectively, and the drain, gate and source of the LHL transistor equip with low, high, and low withstand voltage levels, respectively. Under such a condition, the gate oxide thickness of the medium voltage circuit elements remains the same with the high voltage circuit elements. The inherent component structure of the medium voltage circuit elements realized by the high voltage circuit components would limit the performance of the circuits operating within the medium voltage range MV.

In order to improve the performance of the circuits operating within the medium voltage range MV, the present invention makes the circuit elements operating in different voltage ranges have different gate oxide thicknesses. In the example shown in FIG. 1, the thickness of gate oxide of the low voltage circuit components is a gate oxide thickness GO_LV; the thickness of gate oxide of the medium voltage circuit components is a gate oxide thickness GO_MV; and the thickness of gate oxide of the high voltage circuit components is a gate oxide thickness GO_HV. The gate oxide thickness GO_LV may be 58-75 angstroms (1 angstrom=$1*10^{-10}$ meter), 30-45 angstroms, or 16-22 angstroms when the maximum voltage of the low voltage range LV is 3.3 volts, 1.8 volts, or 1.2 volts, respectively. The gate oxide thickness GO_MV may be 170-230 angstroms, and the gate oxide thickness GO_HV may be 340-480 angstroms. By making the medium voltage circuit components have the unique gate oxide thickness GO_MV, the performance of the circuits operating within the medium voltage range MV can be largely improved. For example, a gain and a slew rate of an input stage (e.g. an input differential pair) of the buffer module 110 can be increased, the mismatch problem in the input stage and a gain/compensation stage of the buffer module 110 can be mitigated, and a power consumption of an output stage of the buffer module 110 can be decreased when changing the gate oxide thickness of the medium voltage circuit components to the gate oxide thickness GO_MV.

According to different applications and design concepts, those with ordinary skill in the art may observe appropriate alternations and modifications. For example, some circuits operating within the medium voltage range MV may be realized by the high voltage circuit components designed for the high voltage range HV. In an example of the present invention, the converting module 108 shown in FIG. 1 is realized by the MHM transistors and/or LHL transistors (i.e. the high voltage circuit components designed for the high voltage range HV whose layout rules are altered).

As to manufacturing the source driving device 10 with different gate oxides thicknesses, please refer to FIGS. 2A-2D. Note that, the components not related to the process of manufacturing the gate oxides of different thicknesses, such as shallow trench isolations (STIs), are omitted for brevity. Please refer to FIG. 2A, a first gate oxide layer GO1 is formed on a substrate SUB by performing a furnace process and/or a chemical vapor deposition (CVD) process. Note that, the thickness of the first gate oxide layer GO1 is approximately half of the gate oxide thickness GO_HV (e.g. 170-230 angstroms). Next, a photo resistor layer PR1 is formed on the first gate oxide layer GO1 to define a high voltage area A_HV in FIG. 2B. For example, the photo resistor layer PR1 may first cover the first gate oxide layer GO1 and the photo resistor layer PR1 outside the high voltage area A_HV is removed by using a photo mask PM1. After an etching process is performed, the first gate oxide layer GO1 outside the high voltage area A_HV is removed. Note that, the high voltage area A_HV represents the area comprising the high voltage circuit components operating in the high voltage range HV.

Figure 2A:
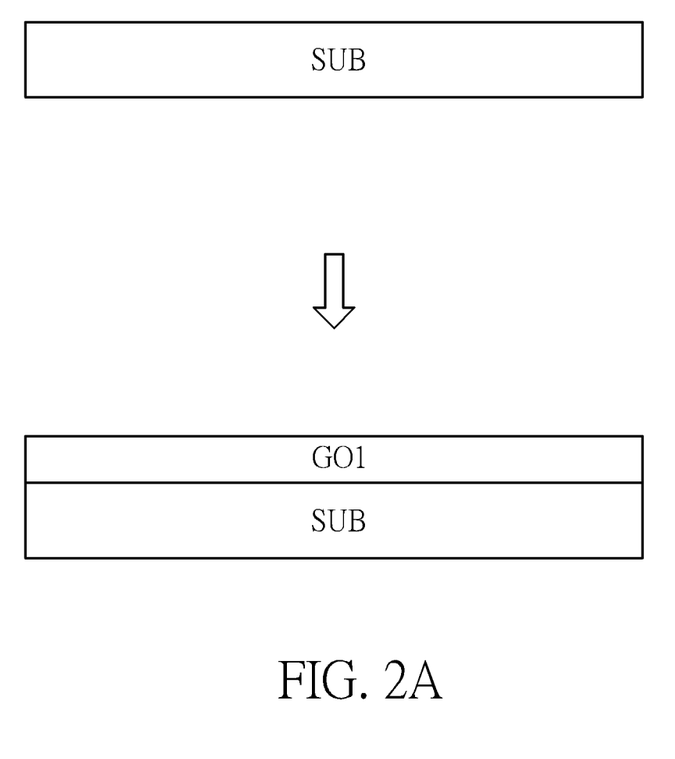
FIGS. 2A-2D are cross-section views of the source driving device shown in FIG. 1 during the manufacturing process.
Figure 2B:
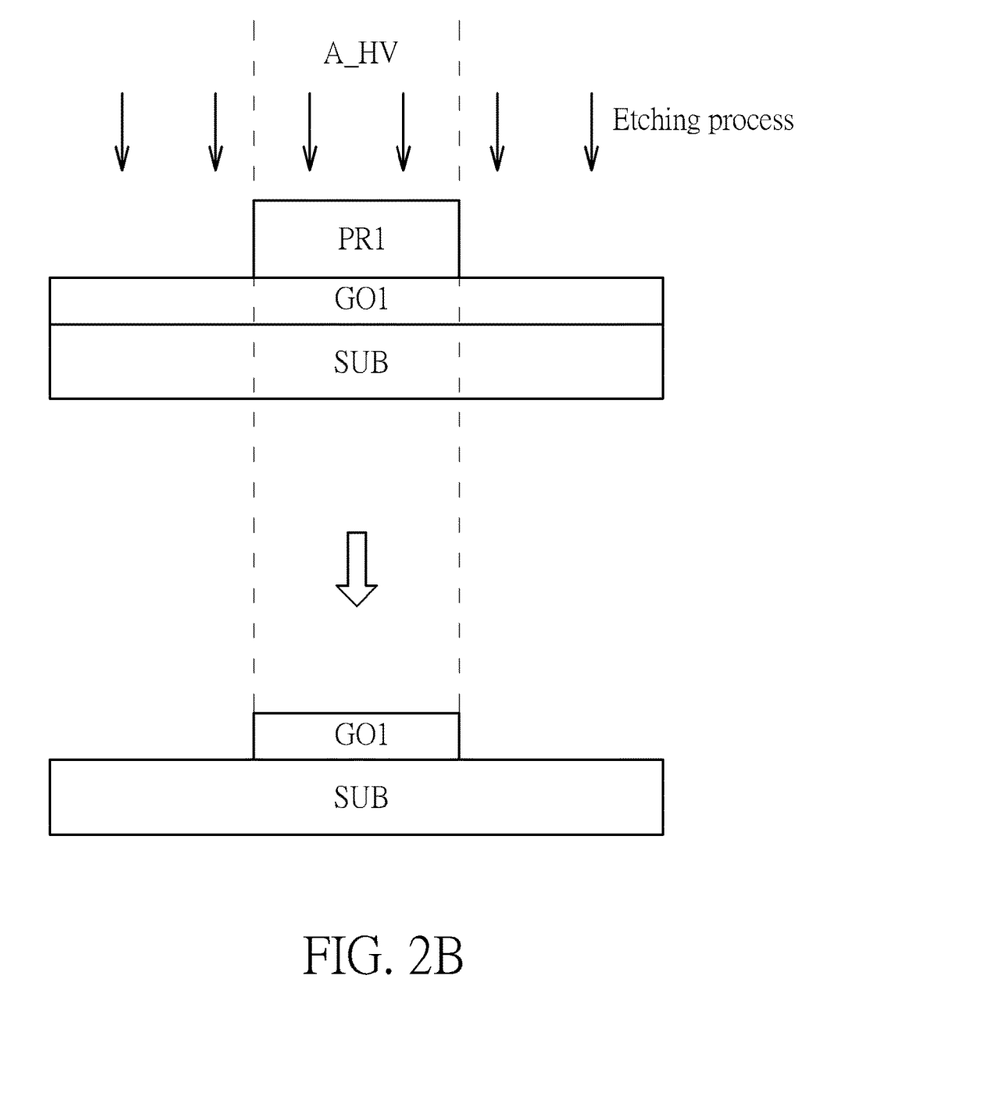
Figure 2C:
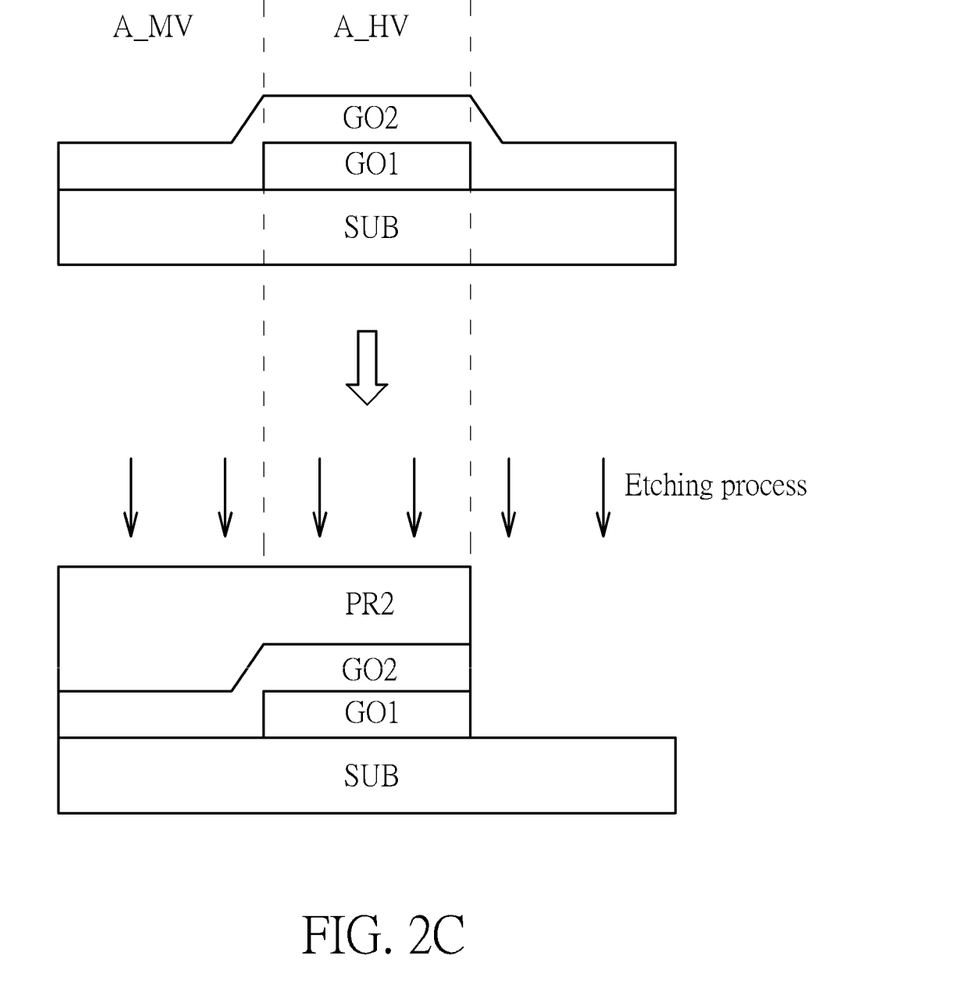

In FIG. 2C, a second gate oxide layer GO2 is formed on the substrate SUB by performing another furnace process and/or CVD process. Similar to FIG. 2B, a photo resistor layer PR2 is formed on the substrate SUB to cover the high voltage area A_HV and a medium voltage area A_MV, wherein the medium voltage area A_MV represents the area comprising the medium voltage circuit components operating in the medium voltage range MV. In an example, the photo resistor layer PR2 outside the high voltage area A_HV and the medium voltage area A_MV is removed by using a photo mask PM2. The thickness of the second gate oxide layer GO2 is approximately half of the gate oxide thickness GO_HV or the gate oxide thickness GO_MV (e.g. 170-230 angstroms). Next, the second gate oxide layer GO2 outside the high voltage area A_HV and the medium voltage range A_MV is removed by performing an etching process.

Figure 2D:
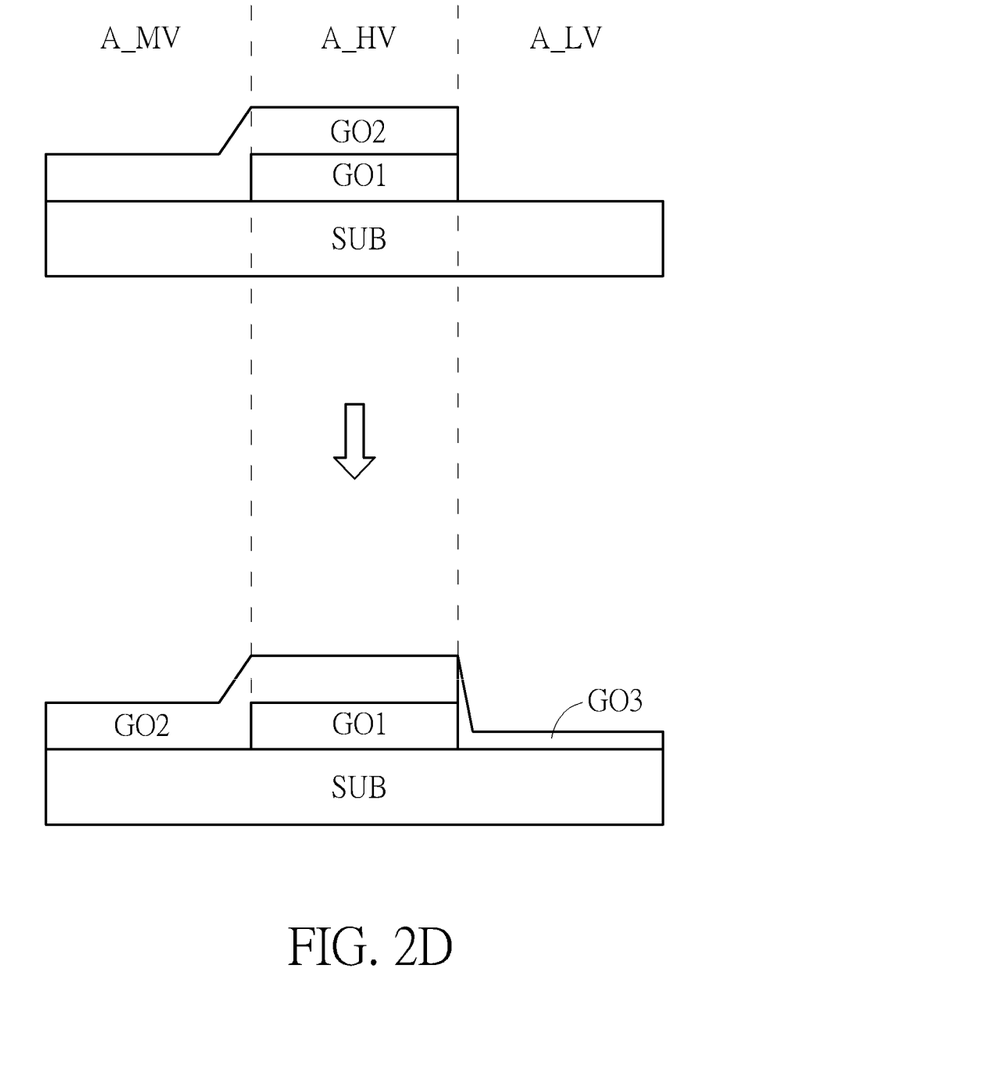

Please refer to FIG. 2D, the photo resistor layer PR2 is removed after removing the second gate oxide layer GO2 outside the high voltage area A_HV and the medium voltage area A_MV. Finally, a third gate oxide layer GO3 is form on a low voltage area A_LV by a furnace process, wherein the low voltage area A_LV represents the area comprising the low voltage circuit components operating in the low voltage range LV. The thickness of the third gate oxide layer GO3 is the gate oxide thickness GO_LV. Note that, because the third gate oxide layer GO3 is formed only by the furnace process, the third gate oxide layer GO3 is not or slightly formed on the high voltage area A_HV and the medium voltage area A_MV. That is, the thicknesses of gate oxide layer on the high voltage area A_HV and the medium voltage area A_MV does not change or slight increases (increases by smaller than 15 angstroms). As shown in FIG. 2D, the gate oxide thickness in the high voltage area A_HV equals the sum of the thicknesses of the first gate oxide layer GO1 and the second gate oxide layer GO2, the gate oxide thickness in the medium voltage area A_MV equals the thickness of the second gate oxide layer GO2, and the gate oxide thickness in the low voltage area A_MV equals the thickness of the third gate oxide layer GO3. The source driving device comprising the gate oxide layer equipping with 3 different thicknesses are therefore acquired.

Figure 3:
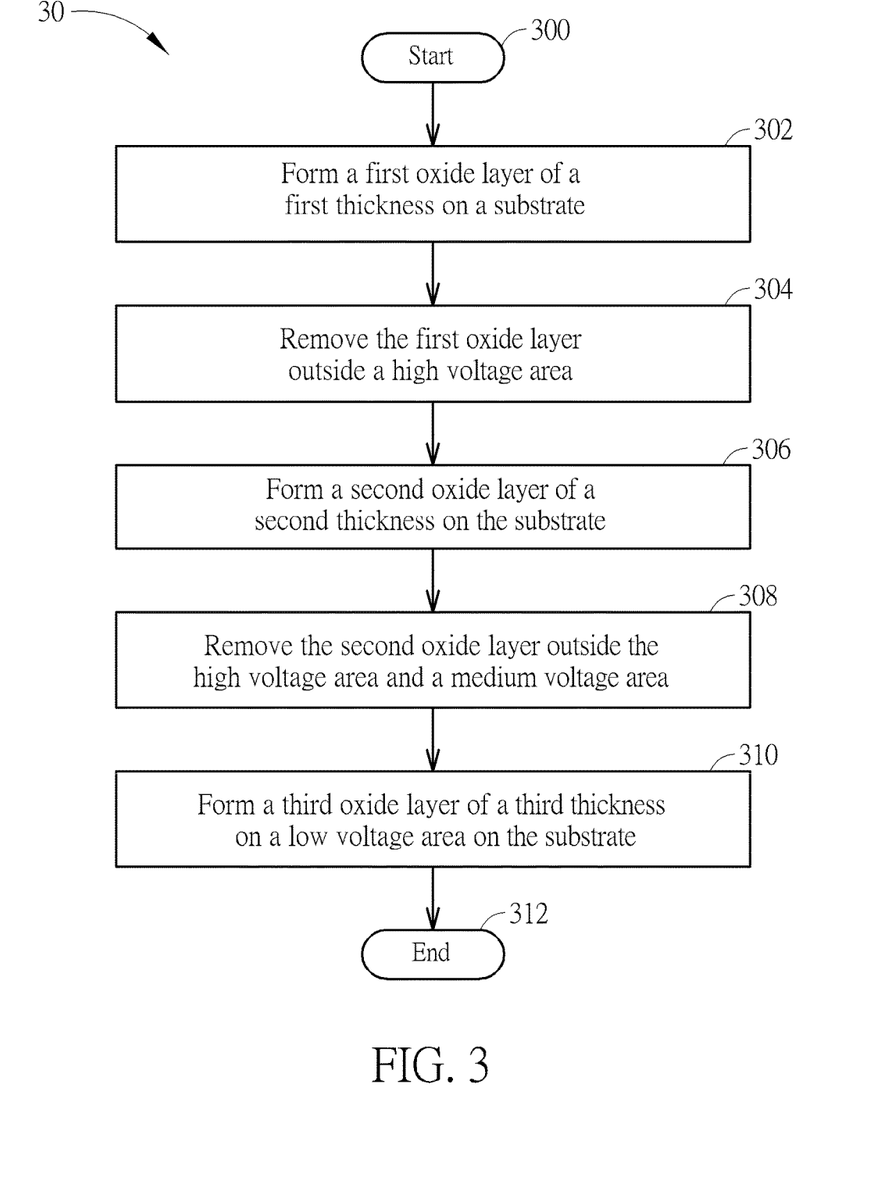
FIG. 3 is a flowchart of a process according to an example of the present invention.

The process of manufacturing the source driving device 10 with different gate oxides thicknesses can be summarized into a process 30 shown in FIG. 3. The process 30 is utilized to manufacture a source driving device for a display system and comprises the following steps:

Step 300: Start.
Step 302: Form a first oxide layer of a first thickness on a substrate.
Step 304: Removing the first oxide layer outside a high voltage area.
Step 306: Form a second oxide layer of a second thickness on the substrate.
Step 308: Remove the second oxide layer outside the high voltage area and a medium voltage area.
Step 310: Form a third oxide layer of a third thickness on a low voltage area on the substrate.
Step 312: End.

According to the process 30, a first oxide layer of a first thickness is formed on a substrate by a furnace process and/or a CVD process (step 302). Next, the first oxide layer outside a high voltage area is removed. For example, a first photo resistor layer is formed on the substrate and then the first photo resistor layer outside the high voltage area is removed by using a photo mask. By performing an etching process, the gate oxide layer not covered by the photo resistor layer (i.e. the gate oxide layer outside the high voltage area) is removed (Step 304).

Similarly to steps 302 and 304, a second gate oxide layer of a second thickness is formed on the substrate by the furnace process and/or the CVD process and the second gate oxide layer outside the high voltage area and a medium voltage area is removed (steps 306 and 308). Finally, a third oxide layer of a third thickness is form on a low voltage area by the furnace process. Because the third gate oxide layer is formed only by the furnace process, the third gate oxide layer is not or barely formed on the high voltage area and the medium voltage area. In other words, the thickness of gate oxide layer on the high voltage area (i.e. sum of the first thickness and the second thickness) and the thickness of the medium voltage area (i.e. the second thickness) remain the same or slight increase. As a result, the gate oxide layer in the high voltage area becomes the second gate oxide layer stack on the first gate oxide layer, the gate oxide layer in the medium voltage area is the second gate oxide layer, and the gate oxide layer in the low voltage area is the third gate oxide layer. The source driving device with 3 different gate oxide layers is therefore acquired.

In the above examples, the circuit components operating within different voltage ranges equip with different gate oxide thicknesses. Instead of utilizing the high voltage circuit components designed for the high voltage range to realize the medium voltage circuit components operating within the medium voltage range, the present invention makes the medium circuit components equip with unique gate oxide thickness. The performance of the circuits operating within the medium voltage range is therefore improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A source driving device for a display system, comprising:
   a receiving module, for receiving display data;
   a register module, for sorting pixel data included in the display data to generate sorted pixel data;
   a latch module, for outputting sequenced display data to a level shifting module;
   a level shifting module, for adjusting the sequenced display data from a low voltage range to a medium voltage range;
   a converting module, for converting the sequenced display data to analog display voltages;
   a buffer module, for generating a plurality source driving signals according to the analog display voltages; and
   an output switching module, for outputting the plurality source driving signals to a display device of the display system operating in a high voltage range;
   wherein the receiving module, the register module, and the latch module are realized by low voltage circuit components equipping with a first gate oxide thickness;
   wherein the converting module and the buffer module are realized by the low voltage circuit components and medium voltage circuit components equipping with a second gate oxide thickness;
   wherein the output switching module is realized by high voltage circuit components equipping with a third gate oxide thickness;
   wherein the first gate oxide thickness is smaller than the second gate oxide thickness and the second gate oxide thickness is smaller than the third gate oxide thickness.

2. The source driving device of claim 1, wherein the level shifting module is realized by the low voltage circuit components and medium voltage circuit components equipping with the second gate oxide thickness.

3. The source driving device of claim 1, wherein maximum voltage of the low voltage range is one of 3.3 volts, 1.8 volts, and 1.2 volts, the maximum voltage of the medium voltage range is between 5-11 volts, and the maximum voltage of the high voltage range is between 15-21 volts.

4. The source driving device of claim 1, wherein the first gate oxide thickness is between 58-75 angstroms when maximum voltage of the low voltage range is 3.3 volts, the first gate oxide thickness is between 30-45 angstroms when the maximum voltage of the low voltage range is 1.8 volts, the first gate oxide thickness is between 16-22 angstroms when the maximum voltage of the low voltage range is 1.2 volts, the second gate oxide thickness is between 170-230 angstroms, and the third gate oxide thickness is between 340-480 angstroms.

5. A manufacture method of a source driving device in a display system, the manufacture method comprising:
    forming a first oxide layer of a first thickness on a substrate;
    removing the first oxide layer outside a high voltage area;
    forming a second oxide layer of a second thickness on the substrate;
    removing the second oxide layer outside the high voltage area and a medium voltage area; and
    forming a third oxide layer of a third thickness on a low voltage area on the substrate;
    wherein the high voltage area comprises a plurality of high voltage circuit components operating in a high voltage range, the medium voltage area comprises a plurality of medium voltage circuit components operating in a medium voltage range, the low-voltage area comprises a plurality of low voltage circuit components operating in a low voltage range.

6. The manufacture method of claim 5, wherein maximum voltage of the low voltage range is one of 3.3 volts, 1.8 volts, and 1.2 volts, the maximum voltage of the medium voltage range is between 5-11 volts, and the maximum voltage of the high voltage range is between 15-21 volts.

7. The manufacture method of claim 5, wherein the first thickness is between 170-230 angstroms, the second thickness is between 170-230 angstroms, the third thickness is between 58-75 angstroms when maximum voltage the low voltage range is 3.3 volts, the third thickness is between 30-45 angstroms when the maximum voltage the low voltage range is 1.8 volts, and the third thickness is between 16-22 angstroms when the maximum voltage the low voltage range is 1.2 volts.

* * * * *

UNITED STATES PATENT AND TRADEMARK OFFICE
CERTIFICATE OF CORRECTION

PATENT NO. : 9,898,983 B1  
APPLICATION NO. : 15/344575  
DATED : February 20, 2018  
INVENTOR(S) : Yu-Hao Hsu et al.

Page 1 of 1

It is certified that error appears in the above-identified patent and that said Letters Patent is hereby corrected as shown below:

On the Title Page

Item (73), correct the name of the assignee from "NOVATEK Mircroelectronics Corp." to --NOVATEK Microelectronics Corp.--.

Signed and Sealed this  
Tenth Day of April, 2018

Andrei Iancu  
*Director of the United States Patent and Trademark Office*